(12) United States Patent
Suga et al.

(10) Patent No.: US 12,002,840 B2
(45) Date of Patent: Jun. 4, 2024

(54) LIGHT EMITTING ELEMENT AND MANUFACTURING METHOD OF LIGHT EMITTING ELEMENT

(71) Applicant: CANON KABUSHIKI KAISHA, Tokyo (JP)

(72) Inventors: Takako Suga, Kanagawa (JP); Takeshi Uchida, Kanagawa (JP); Takeshi Yoshioka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 204 days.

(21) Appl. No.: 17/577,598

(22) Filed: Jan. 18, 2022

(65) Prior Publication Data

US 2022/0139997 A1    May 5, 2022

Related U.S. Application Data

(63) Continuation of application No. PCT/JP2020/028840, filed on Jul. 28, 2020.

(30) Foreign Application Priority Data

Jul. 30, 2019   (JP) ................. 2019-139551

(51) Int. Cl.
*H01L 33/10*    (2010.01)
*H01L 27/15*    (2006.01)
(Continued)

(52) U.S. Cl.
CPC .......... *H01L 27/15* (2013.01); *H01L 33/0075* (2013.01); *H01L 33/08* (2013.01);
(Continued)

(58) Field of Classification Search
None
See application file for complete search history.

(56) References Cited

U.S. PATENT DOCUMENTS

| 5,898,722 A | 4/1999 | Ramdani et al. |
| 6,844,572 B2 | 1/2005 | Sawaki et al. |

(Continued)

FOREIGN PATENT DOCUMENTS

| CN | 1893207 A | 1/2007 |
| CN | 103311805 A | 9/2013 |

(Continued)

OTHER PUBLICATIONS

Notice of Reasons for Refusal in Japanese Application No. 2019-139551 (dated Aug. 2023).

(Continued)

*Primary Examiner* — Bilkis Jahan
(74) *Attorney, Agent, or Firm* — Venable LLP

(57) ABSTRACT

The light emitting element according to the present disclosure comprises a first active layer that emits light having a first wavelength by injecting current, a second active layer that emits light having a second wavelength different from the first wavelength by absorbing the light having the first wavelength, and a first reflecting mirror in which a reflectance of light having the first wavelength is higher than a reflectance of light having the second wavelength, wherein the first reflecting mirror is disposed at a position closer to an emission end, from which the light emitted by the first active layer or the second active layer exits outside, than the first active layer and the second active layer.

18 Claims, 9 Drawing Sheets

(51) Int. Cl.
  *H01L 33/00* (2010.01)
  *H01L 33/08* (2010.01)
  *H01L 33/46* (2010.01)
  *H01L 33/06* (2010.01)
  *H01L 33/32* (2010.01)

(52) U.S. Cl.
  CPC ............ *H01L 33/105* (2013.01); *H01L 33/46* (2013.01); *H01L 33/465* (2013.01); *H01L 33/06* (2013.01); *H01L 33/32* (2013.01)

(56) References Cited

U.S. PATENT DOCUMENTS

| | | | |
|---|---|---|---|
| 7,126,975 B2* | 10/2006 | Iwasaki | H01S 3/0959 372/74 |
| 7,839,913 B2* | 11/2010 | Uchida | H01S 5/423 372/43.01 |
| 8,426,843 B2 | 4/2013 | Albrecht et al. | |
| 8,995,489 B2 | 3/2015 | Hara | |
| 11,600,751 B2 | 3/2023 | Avramescu et al. | |
| 2002/0136255 A1 | 9/2002 | Takayama et al. | |
| 2007/0001578 A1 | 1/2007 | Iki et al. | |
| 2011/0002353 A1* | 1/2011 | Sekiguchi | B82Y 20/00 372/46.01 |
| 2012/0106587 A1* | 5/2012 | Matsuu | H01S 5/0654 372/107 |
| 2012/0256161 A1 | 10/2012 | Sabathil et al. | |
| 2017/0213868 A1 | 7/2017 | Damilano et al. | |
| 2019/0158352 A1 | 5/2019 | Lu et al. | |

FOREIGN PATENT DOCUMENTS

| | | |
|---|---|---|
| DE | 102018111021 A1 | 6/2019 |
| JP | 6-310804 A | 11/1994 |
| JP | 8-288549 A | 11/1996 |
| JP | 11-274558 A | 10/1999 |
| JP | 2003-347585 A | 12/2003 |
| JP | 2008-124287 A | 5/2008 |
| JP | 2009-070893 A | 4/2009 |
| JP | 2009-212308 A | 9/2009 |
| JP | 2010-541217 A | 12/2010 |
| JP | 2012-521644 A | 9/2012 |
| WO | 2006/62588 A1 | 6/2006 |
| WO | 2021/020378 A1 | 2/2021 |

OTHER PUBLICATIONS

International Preliminary Report on Patentability in International Application No. PCT/JP2020/028840 (dated Feb. 2022).
Extended European Search Report in European Application No. 20846408.1 (dated Jul. 2023).
International Search Report in International Application No. PCT/JP2020/028840 (dated Oct. 2020).
Article 19 Amendment in International Application No. PCT/JP2020/028840 (dated Dec. 2020).
Informal Comments in International Application No. PCT/JP2020/028840 (dated Dec. 2020).
First Office Action in Chinese Application No. 202080054210.2 (Feb. 2024).
CN 1893207, 2007/0001578 A1.
CN 103311805, U.S. Pat. No. 8,995,489 B2.

\* cited by examiner

LIGHT EMITTING ELEMENT AND MANUFACTURING METHOD OF LIGHT EMITTING ELEMENT

CROSS-REFERENCE TO RELATED APPLICATIONS

This application is a Continuation of International Patent Application No. PCT/JP2020/028840, filed Jul. 28, 2020, which claims the benefit of Japanese Patent Application No. 2019-139551, filed Jul. 30, 2019, both of which are hereby incorporated by reference herein in their entirety.

BACKGROUND OF THE INVENTION

Field of the Invention

The present invention relates to a light emitting element and a manufacturing method of a light emitting element.

Description of the Related Art

Japanese Patent Application Laid-Open No. 2009-70893 discloses a technique for forming light emitting elements that emit light of different wavelengths on the same wafer. In this technique, multiple light emitting regions that emit light of different wavelengths can be formed adjacent to each other by repeating a process of forming a mask on a portion other than a necessary portion and then forming an active layer for each wavelength several times.

According to the method of growing the active layers on the same substrate several times as described in Japanese Patent Application Laid-Open No. 2009-70893, it is necessary to repeatedly perform processes for growing the active layer for each wavelength by placing the substrate in a crystal growth apparatus several times. In this case, the following problems may arise.

First, when the active layer is grown, it is necessary to clean the growth surface at an atomic level. Since the cleanliness of the surface greatly affects the yield and the quality of the active layer, multiple growths of the active layer may cause degradation and/or instability in terms of yield.

The growth process of the active layer occupies a large proportion of the manufacturing cost of the light emitting device. In the case where the active layer is grown several times, the processing time including installation of the substrate in the crystal growth apparatus, raising temperature necessary for the crystal growth, and the like are demanded for each growth step, so that the manufacturing cost is significantly increased.

As described above, in the method in which the active layer is grown several times, it may be an objective that the yield and stability are improved while the quality of the active layer is maintained, and the manufacturing cost is further reduced. Therefore, an objective of the present invention is to provide a light emitting element and a method of manufacturing the light emitting element, which can be manufactured by a simpler process.

SUMMARY OF THE INVENTION

According to an aspect of the present invention, there is provided a light emitting element comprising a first active layer that emits light having a first wavelength by injecting current, a second active layer that emits light having a second wavelength different from the first wavelength by absorbing the light having the first wavelength, and a first reflecting mirror in which a reflectance of light having the first wavelength is higher than a reflectance of light having the second wavelength, wherein the first reflecting mirror is disposed at a position closer to an emission end, from which the light emitted by the first active layer or the second active layer exits outside, than the first active layer and the second active layer, wherein the light emitting element further comprises, in a plan view, a first region and a second region, wherein the first active layer and the second active layer are disposed in each of the first region and the second region, wherein the emitting amount of light having the first wavelength is greater than the emitting amount of light having the second wavelength in the first region, and wherein the emitting amount of light having the second wavelength is greater than the emitting amount of light having the first wavelength in the second region.

According to another aspect of the present invention, there is provided a manufacturing method of a light emitting element comprising forming a second active layer that emits light having a second wavelength different from a first wavelength by absorbing light having the first wavelength, forming a first active layer that emits the light having the first wavelength by injecting current, and forming a first reflecting mirror in which a reflectance of light having the first wavelength is higher than a reflectance of light having the second wavelength, wherein the first reflecting mirror is disposed at a position closer to an emission end, from which the light emitted by the first active layer or the second active layer exits outside, than the first active layer and the second active layer, wherein the light emitting element further comprises, in a plan view, a first region and a second region, wherein the first active layer and the second active layer are disposed in each of the first region and the second region, wherein the emitting amount of light having the first wavelength is greater than the emitting amount of light having the second wavelength in the first region, and wherein the emitting amount of light having the second wavelength is greater than the emitting amount of light having the first wavelength in the second region.

Further features of the present invention will become apparent from the following description of exemplary embodiments with reference to the attached drawings.

DESCRIPTION OF THE EMBODIMENTS

Figure 1:
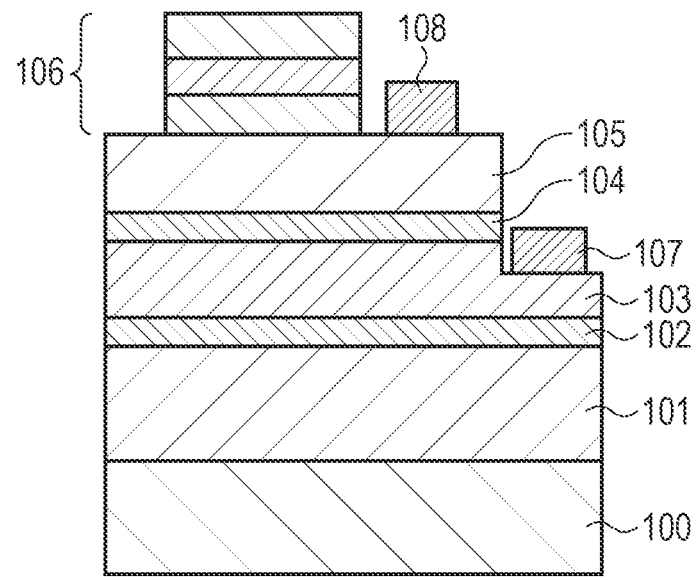
FIG. 1 is a cross-sectional view schematically showing a structure of a light emitting device according to the first embodiment.

Hereinafter, embodiments of the present invention will be described with reference to the drawings. In the drawings, the same or corresponding elements are denoted by the same reference numerals, and the description thereof may be omitted or simplified.

First Embodiment

FIG. 1 is a cross-sectional view schematically showing a structure of a light emitting device according to the present embodiment. As shown in FIG. 1, the light emitting device of the present embodiment has a stacked structure in which a first semiconductor layer 101, a second active layer 102, a second semiconductor layer 103, a first active layer 104, a third semiconductor layer 105, and a first reflecting mirror 106 are arranged in this order on a substrate 100. These layers may be formed by epitaxial growth. The light emitting element of the present embodiment includes a first electrode 107 provided over the second semiconductor layer 103 and a second electrode 108 provided over the third semiconductor layer 105.

The first active layer 104 emits light having a wavelength distribution in which the first wavelength is a main peak when an electric current is injected. In this specification, "light having a wavelength distribution in which the first wavelength is the main peak" may be simply referred to as "light of the first wavelength". When the second active layer 102 absorbs light of a first wavelength, the second active layer 102 emits light of a second wavelength different from the first wavelength by optical excitation. The light of the first wavelength may be, for example, blue light having a wavelength of about 450 nm. The light of the second wavelength may be, for example, green light having a wavelength of about 525 nm.

The first active layer 104 and the second active layer 102 may be formed of a single layer material, or may be formed of a multiple quantum well structure in which a plurality of pairs of quantum well layers and barrier layers are alternately stacked. By properly setting materials, compositions, thicknesses, numbers of pairs, and the like of the active layer, the quantum well layer, and the barrier layer depending on the type of the substrate, and designing the active layer, the quantum well layer, and the barrier layer to have a desired band gap, a light emitting element that emits light of a desired wavelength can be realized. For example, if the material of the substrate 100 is sapphire and the material of the active layer is InGaN, the central emission wavelength can be changed by changing a ratio of In. More a ratio of In increases, longer the central emission wavelength becomes.

For example, the first semiconductor layer 101 is n-type or i-type, the second semiconductor layer 103 is n-type, and the third semiconductor layer 105 is p-type. In other words, the first active layer 104 is inserted between a semiconductor layer of a first conductivity type (n-type) and a semiconductor layer of a second conductivity type (p-type) opposite to the first conductivity type. The second active layer 102 is inserted between a first conductivity-type or i-type semiconductor layer and a first conductivity-type semiconductor layer. The conductivity type of the substrate 100 may be any of n-type, p-type, and i-type.

Note that an i-type semiconductor layer in this specification means a non-doped (undoped) semiconductor layer. Non-doped may include both those that are not intentionally doped with dopants for controlling conductivity type during the growth of the semiconductor layer and those that are doped with substantially the same number of p-type and n-type dopants. The carrier concentration in the i-type semiconductor layer is preferably less than or equal to $1\times10^{16}$ cm$^{-3}$.

When each semiconductor layer is made of a group III nitride semiconductor such as GaN or AlGaN-based material, Si, Ge, or the like is used as an n-type dopant, and Mg, Zn, or the like is used as a p-type dopant. If each semiconductor layer is formed of an AlGaAs-based material which is a group III-V semiconductor, a group II element (Mg, Zn, etc.) is used as a p-type dopant, a group VI element (Se, etc.) is used as an n-type dopant, and a group IV element (C, Si, etc.) is used as a p-type dopant or an n-type dopant.

In the light emitting element of the present embodiment, the emission end from which light is emitted to the outside is the opposite side to the substrate 100, that is, the upper side in FIG. 1. The first reflecting mirror 106 is disposed on the emission end side of the light emitting element. In other words, the upper surface of the first reflecting mirror 106 corresponds to the emission end of the light emitting element. The first reflecting mirror 106 is designed such that the reflectance of the light of the first wavelength is higher than the reflectance of the light of the second wavelength.

The first reflecting mirror 106 is, for example, a distributed Bragg reflecting mirror. Hereinafter, the distributed Bragg reflector is referred to as DBR (Distributed Bragg Reflector). The DBR is a reflecting mirror having a structure in which two thin films having different refractive indexes are formed alternately and periodically to have an optical film thickness of one fourth wavelength. The first reflecting mirror 106 may be a plurality of semiconductor layers formed by epitaxial growth, or may be a plurality of dielectric layers. Among the two types of structures, the structure using a plurality of dielectric layers is preferable because the difference in refractive index between the two thin films can be increased, and high reflectance can be realized with a small number of pairs.

Different potentials are applied to the first electrode 107 and the second electrode 108 so that current can be injected into the first active layer 104. If current is injected into the first active layer 104, the first active layer 104 emits light of a first wavelength. Of the light of the first wavelength emitted from the first active layer 104, a component emitted downward directly enters the second active layer 102. A part of the light having the first wavelength emitted from the first active layer 104 emitted upward is reflected by the first reflecting mirror 106 and enters the second active layer 102. Here, since the reflectance of the first reflecting mirror 106 is designed to be high with respect to the light of the first wavelength, the light of the first wavelength transmitted through the first reflecting mirror 106 is small. Therefore, most of the light of the first wavelength is incident on the second active layer 102.

The second active layer 102 absorbs light of a first wavelength and emits light of a second wavelength by optical excitation. A part of the light of the second wavelength is reflected by the first reflecting mirror 106 and returns to the substrate 100 side. However, since the reflectance of the first reflecting mirror 106 with respect to the light of the second wavelength is designed to be lower than the reflectance of the light of the first wavelength, most of the light of the second wavelength passes through the first reflecting mirror 106 and is emitted in the vertical direction (upper side in FIG. 1) with respect to the substrate 100. Thus, the light emitting element of the present embodiment can selectively emit light of the second wavelength to the outside.

By using the first active layer 104, the second active layer 102, and the first reflecting mirror 106, the light emitting device of the present embodiment can convert light of the first wavelength into light of the second wavelength and selectively emit the light to the outside. By arranging the first reflecting mirror 106, the above-described effect can be obtained in a state where the first active layer 104 and the second active layer 102 are stacked in the thickness direction. Thus, it is not necessary to perform patterning between the formation of the first active layer 104 and the second active layer 102. Therefore, according to the present embodiment, a light emitting device capable of forming a plurality of active layers in a simple process is provided.

The light emitting element of the present embodiment is used, for example, in a pixel of a display device. A display surface of a display device can be formed by fabricating the light emitting elements of the present embodiment in a size of several tens to several hundreds m and arranging them in a plurality of rows and a plurality of columns. Such a display device using an inorganic compound semiconductor LED (Light Emitting Diode) is sometimes referred to as a LED display. The LED display is superior to a liquid crystal display and an organic LED display in terms of lifetime, luminance, and the like. Effects obtained when the light emitting device of the present embodiment is used in a LED display will be described below.

An example of a method for manufacturing a LED display is a method in which light emitting elements manufactured for respective colors such as blue, green, and red are mounted on a substrate of the display. In this method, since a large number of light emitting elements need to be mounted, there is a problem such that the mounting cost is high. Therefore, in order to reduce the mounting cost, it is preferable to form light emitting elements of a plurality of colors on the same wafer so that a plurality of light emitting elements can be mounted together.

In order to form a plurality of light emitting elements on the same wafer, it is necessary to form a plurality of active layers having different emission wavelengths on the same wafer. In the method of forming a mask during formation of a plurality of active layers as described in Japanese Patent Application Laid-Open No. 2009-70893, the manufacturing process becomes complicated and the manufacturing cost increases. The reason is as follows. In a manufacturing process of a light emitting device using a compound semiconductor, a semiconductor layer such as an active layer is formed by epitaxial growth. In the process flow in which the mask is formed during the formation of a plurality of active layers, the epitaxial growth of each layer cannot be performed at once, and the epitaxial growth process must be performed plural times. The epitaxial growth process includes time-consuming processes such as installation of a substrate in a crystal growth apparatus and temperature rise to a growth temperature. If the epitaxial growth process is performed plural times, the number of processes increases in proportion to the number of processes, so that the manufacturing cost increases.

In contrast, the light emitting device of the present embodiment has a structure in which wavelength conversion can be performed in a state in which the first active layer 104 and the second active layer 102 are stacked in the thickness direction. Therefore, patterning is not required between the formation of the first active layer 104 and the second active layer 102. Therefore, even if the light emitting elements of two colors are formed on the same wafer, the two active layers can be continuously formed by epitaxial growth. Therefore, in the manufacturing of the LED display using the light emitting element of the present embodiment, a plurality of active layers can be formed by a simple process, so that the cost can be reduced.

Further, by continuously forming the two active layers by epitaxial growth, surface contamination caused by removal from the crystal growth apparatus or the like is reduced. Therefore, in the manufacture of the light emitting device of the present embodiment, the cleanliness of the growth surface is maintained, so that the effects of improving the yield, stabilizing the manufacturing process, and improving the quality of the active layer can be obtained.

The reason why the light emitting element of the present embodiment can be suitably used as a pixel for the LED display and its effect have been described above. The same applies to the other embodiments described later. However, the applications of the light emitting elements of the present embodiment and the other embodiments are not limited thereto, and may be applied to applications other than display devices such as lighting devices.

In the present embodiment, the emission end corresponds to the upper side in FIG. 1 (the side opposite to the substrate 100), but the emission end may be the side of the substrate 100. In the case where the emission end is on the side of the substrate 100, it is preferable to design a structure or a material such that the absorptance of light in the substrate 100 is low. As examples of a specific design, a material having a low absorptance with respect to the wavelength of light to be emitted may be used for the substrate 100, or the thickness of the substrate 100 may be sufficiently reduced.

Although the first active layer 104 is disposed closer to the emission end than the second active layer 102 in the present embodiment, the order in which the first active layer 104 and the second active layer 102 are stacked may be reversed. If the order of the first active layer 104 and the second active layer 102 is changed, it is necessary to properly change the positions of the first electrode 107 and the second electrode 108 so that a current is injected into the first active layer 104.

However, as shown in FIG. 1, the first active layer 104 is preferably disposed closer to the emission end than the second active layer 102. In other words, the second active layer 102 is preferably disposed between the first active layer 104 and the substrate 100. In this configuration, compared to the case where the first active layer 104 and the second active layer 102 are arranged opposite to each other, there is an advantage in that the contact hole in which the first electrode 107 for current injection is arranged can be made shallow, and the etching amount can be reduced.

It is preferable that the semiconductor layer between the first active layer 104 or the second active layer 102 and the substrate 100 be not doped with a p-type dopant. If the semiconductor layer is doped with a p-type dopant, the crystal quality of the semiconductor layer may deteriorate. If the active layer is grown on the semiconductor layer, the quality of the active layer may deteriorate due to the poor crystal quality of the semiconductor layer. In particular, the quality of the active layer has a large influence on the light emission characteristics if the active layer is made of a GaN-based material. Thus, the light emission characteristics can be improved by not doping the p-type dopant under the active layer.

More specifically, the first semiconductor layer 101 and the second active layer 102 are n-type or i-type in which a p-type dopant is not doped, and the second semiconductor layer 103 is n-type in which a p-type dopant is not doped. Thus, in both the first active layer 104 and the second active layer 102, degradation of the quality of the active layer due to the p-type dopant can be reduced, and the light emitting characteristics are improved.

Second Embodiment

Figure 2:
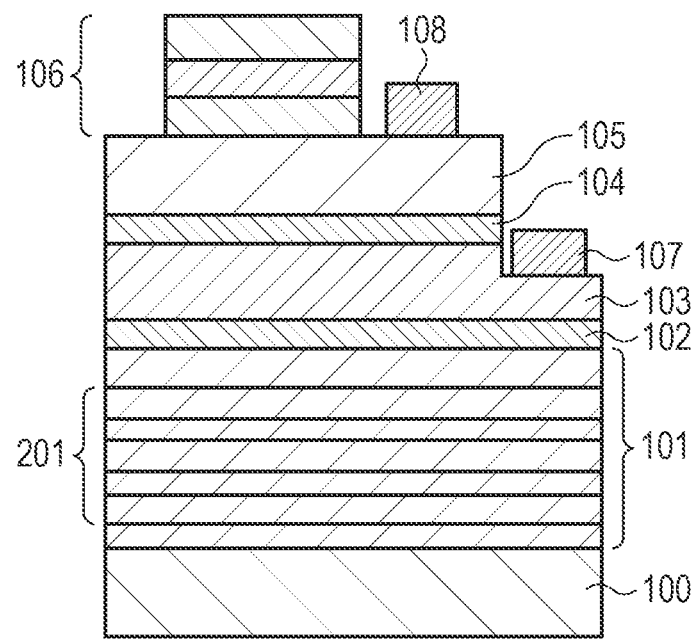
FIG. 2 is a cross-sectional view schematically showing a structure of a light emitting device according to the second embodiment.

The light emitting element of the present embodiment differs from the light emitting element of the first embodiment in that a second reflecting mirror 201 is further provided. FIG. 2 is a cross-sectional view schematically showing the structure of the light emitting device according to the present embodiment. The first semiconductor layer 101 includes a second reflecting mirror 201. The second reflecting mirror 201 is arranged on the side opposite to the first reflecting mirror 106 with respect to the first active layer 104 and the second active layer 102. Similarly to the first reflecting mirror 106, the second reflecting mirror 201 is designed such that the reflectance with respect to the light of the first wavelength is higher than the reflectance with respect to the light of the second wavelength.

The second reflecting mirror 201 is, for example, a DBR. In this case, the second reflecting mirror 201 may be a DBR in which two types of semiconductor layers having different refractive indices are alternately stacked. Examples of two different types of semiconductor layers constituting the DBR include AlGaN and InGaN.

The light having the first wavelength emitted from the first active layer 104 is emitted in both the upper direction and the lower direction in FIG. 2. A part of the light having the first wavelength emitted downward from the first active layer 104 is absorbed by the second active layer 102. At this time, the second active layer 102 emits light of the second wavelength by optical excitation. Another part of the light of the first wavelength emitted downward is transmitted without being absorbed by the second active layer 102. The light having the first wavelength transmitted through the second active layer 102 is reflected by the second reflecting mirror 201 and reenters the second active layer 102 to excite the light having the second wavelength. On the other hand, the light having the first wavelength emitted upward from the first active layer 104 is reflected by the first reflecting mirror 106, enters the second active layer 102, and excites the light having the second wavelength, as described in the first embodiment.

As described above, in the present embodiment, the second reflecting mirror 201 is arranged on the side opposite to the first reflecting mirror 106 with respect to the first active layer 104 and the second active layer 102. According to this configuration, since the light of the first wavelength emitted downward from the first active layer 104 and transmitted through the second active layer 102 can be returned to the second active layer 102 again, the conversion efficiency from the light of the first wavelength to the light of the second wavelength can be improved. Therefore, the light emission efficiency of the light of the second wavelength is improved. In addition, leakage of light of the first wavelength can be reduced.

Here, it is preferable that the first reflecting mirror 106 and the second reflecting mirror 201 are designed to have a film thickness of each layer to form a resonator for the first wavelength. More specifically, the film thickness of each layer may be designed such that the reciprocal length of light propagating between the first reflecting mirror 106 and the second reflecting mirror 201 is an integer multiple of half of the first wavelength. Due to the above design, the conversion efficiency from the light of the first wavelength to the light of the second wavelength can be further improved.

The effect of the present embodiment will be described in more detail with reference to the results of simulation in the case where the first reflecting mirror 106 and the second reflecting mirror 201 form a resonator. First, a layer structure of a simulation model of a light emitting element will be described with reference to FIGS. 3A and 3B.

Figure 3A:
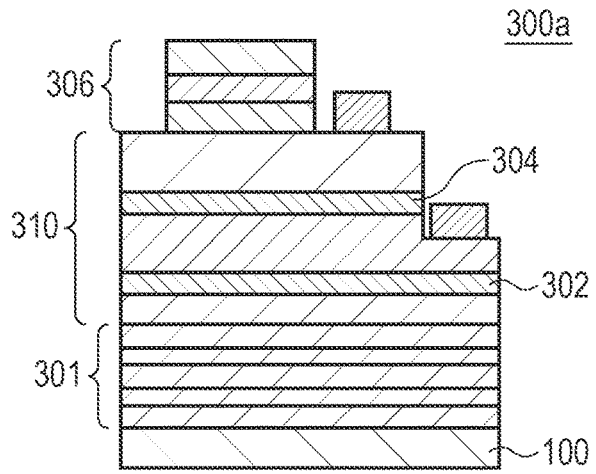
FIG. 3A is a cross-sectional view showing a model of the light emitting device used in the simulation of the second embodiment.

FIG. 3A shows a cross-sectional view of a light emitting element 300a that is a model used for simulation of a structure corresponding to the present embodiment. The light emitting element 300a has a stacked structure in which a GaN/AlInN semiconductor DBR 301 (10 pairs), a 1λ resonator 310 made of GaN, and a SiO$_2$/SiN dielectric DBR 306 (6 pairs) are arranged in this order on a GaN substrate 100. The 1λ resonator 310 includes a blue quantum well active layer 304 (light emission wavelength of 450 nm) and a green quantum well active layer 302 (light emission wavelength of 525 nm). The 1λ resonator 310 is configured to have an optical film thickness of 1λ (1 wavelength) including the layer thicknesses of these two active layers. The designed wavelength of each DBR and 1) resonator 310 is 450 nm which is the same as the emission wavelength of the blue quantum well active layer 304. The absorptance of light having a wavelength of 450 nm in the green quantum well active layer 302 is designed to be 5.8% when light having a wavelength of 450 nm is transmitted from one surface to the other surface. This design can be achieved by adjusting the number of quantum wells.

Figure 3B:
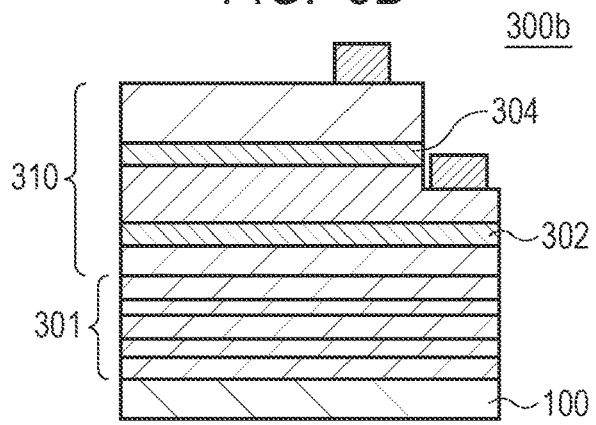
FIG. 3B is a cross-sectional view showing a model of the light emitting device used in the simulation of the second embodiment.

On the other hand, FIG. 3B shows a cross-sectional view of a light emitting element 300b that is a model used for simulation of a comparative example with respect to the present embodiment. The light emitting element 300b is a model in which the SiO$_2$/SiN dielectric DBR 306 is excluded from the configuration of the light emitting element 300a, and does not constitute a resonator.

Figure 3C:
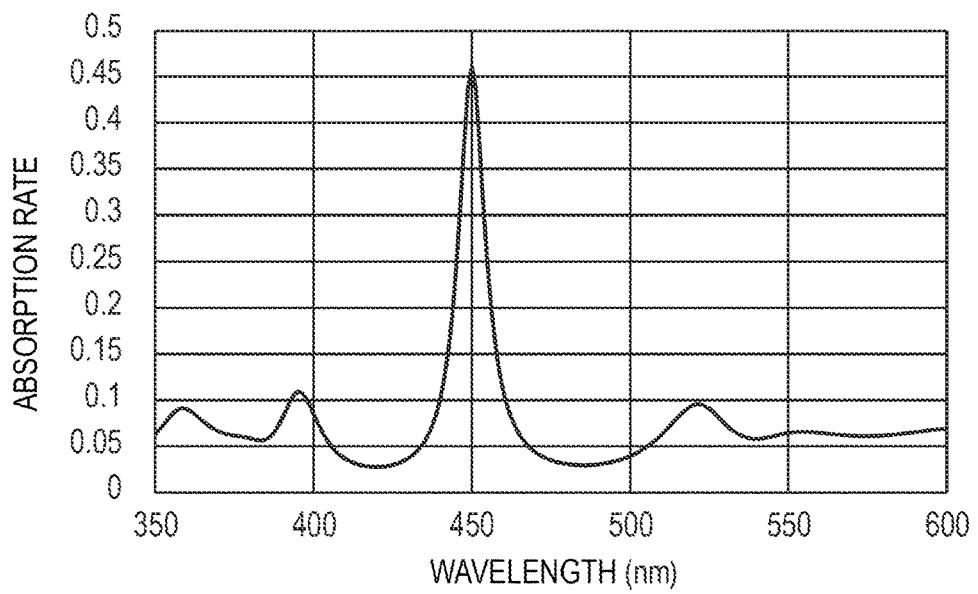
FIG. 3C is a graph showing a simulation result of the second embodiment.

FIG. 3C is a graph showing a simulation result of the absorptance in the green quantum well active layer 302 if light is incident in a direction perpendicular to the lamination surface of the semiconductor layer. In FIG. 3C, the vertical axis represents the absorptance in the green quantum well active layer 302, and the horizontal axis represents the wavelength of incident light. FIG. 3C shows a simulation result according to a model of the light emitting element 300a (i.e., with the $SiO_2$/SiN dielectric DBR 306). In addition, in the simulation of the comparative example using the model of the light emitting element 300b, the absorptance with respect to light having a wavelength of 450 nm was 0.044.

Figure 4:
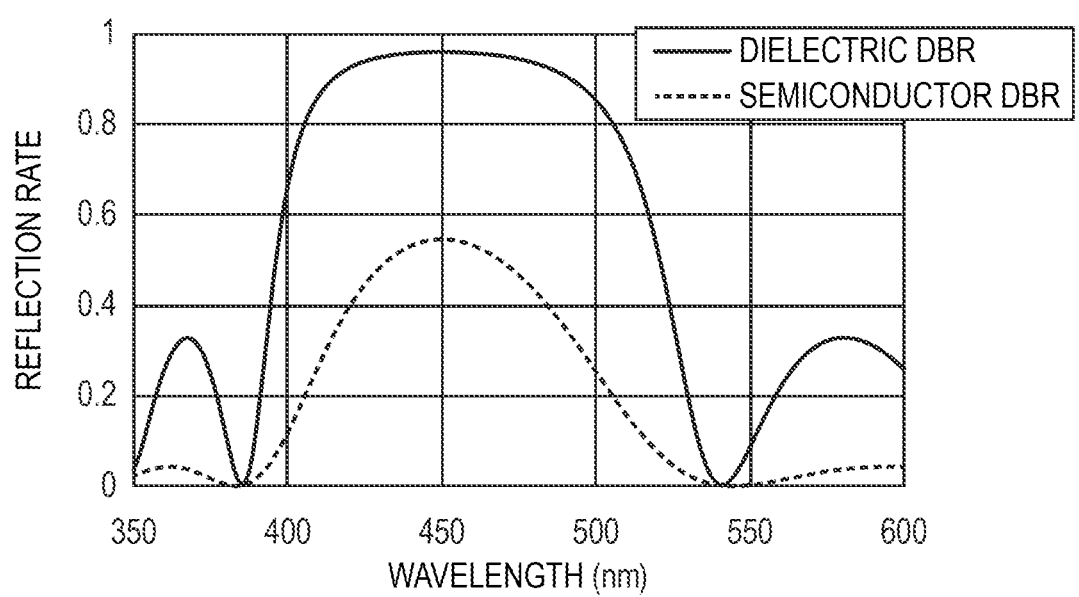
FIG. 4 is a graph showing a reflectance characteristic of a distributed Bragg reflector used in the simulation of the second embodiment.

FIG. 4 is a graph showing the reflectance characteristics of the $SiO_2$/SiN dielectric DBR 306 and the reflectance characteristics of the GaN/AlInN semiconductor DBR 301 used in the simulation. In FIG. 4, the vertical axis represents the reflectance, and the horizontal axis represents the wavelength of the incident light. The solid line in FIG. 4 indicates the reflectance characteristics of the $SiO_2$/SiN dielectric DBR 306, and the broken line indicates the reflectance characteristics of the GaN/AlInN semiconductor DBR 301. In the $SiO_2$/SiN dielectric DBR 306, the reflectance at a wavelength of 450 nm is 0.96, indicating a high value. On the other hand, the reflectance at a wavelength of 525 nm is 0.4 or less, indicating a low value. As for the GaN/AlInN semiconductor DBR 301, a similar tendency is observed, although not as significant as the $SiO_2$/SiN dielectric DBR 306. The reflectance characteristics of FIG. 4 are obtained by optical simulation.

As will be understood from the above description, the absorptance of light having a wavelength of 450 nm in the green quantum well active layer 302 becomes approximately 10 times greater by providing the $SiO_2$/SiN dielectric DBR 306. Therefore, it is found that the absorption efficiency of the light of the first wavelength (450 nm) can be improved and the emission efficiency of the light of the second wavelength (525 nm) can be improved by configuring the resonator structure by the two reflecting mirrors. In addition, since the $SiO_2$/SiN dielectric DBR 306 has a high reflectance at the first wavelength and a low reflectance at the second wavelength, leakage of light at the first wavelength can be reduced.

In this way, the absorption efficiency of the light of the first wavelength can be improved only by providing the DBR without processing the active layer, and the emission efficiency of the light of the second wavelength can be improved by a simple process.

The emission intensity of the light of the second wavelength can be changed depending on whether or not the $SiO_2$/SiN dielectric DBR 306 is formed in the upper layer. That is, by forming the $SiO_2$/SiN dielectric DBR 306 at a desired location in the wafer surface, it is possible to provide a location where light of the second wavelength is selectively emitted without processing on the semiconductor layer under the $SiO_2$/SiN dielectric DBR 306. Therefore, it is possible to form a portion from which light of the second wavelength is selectively emitted by a simple process.

The above simulation is based on the premise that light propagates in a direction perpendicular to the lamination surface. However, a similar effect can be obtained even for light propagating in an oblique direction although a difference in resonance wavelength occurs.

Figure 5A:
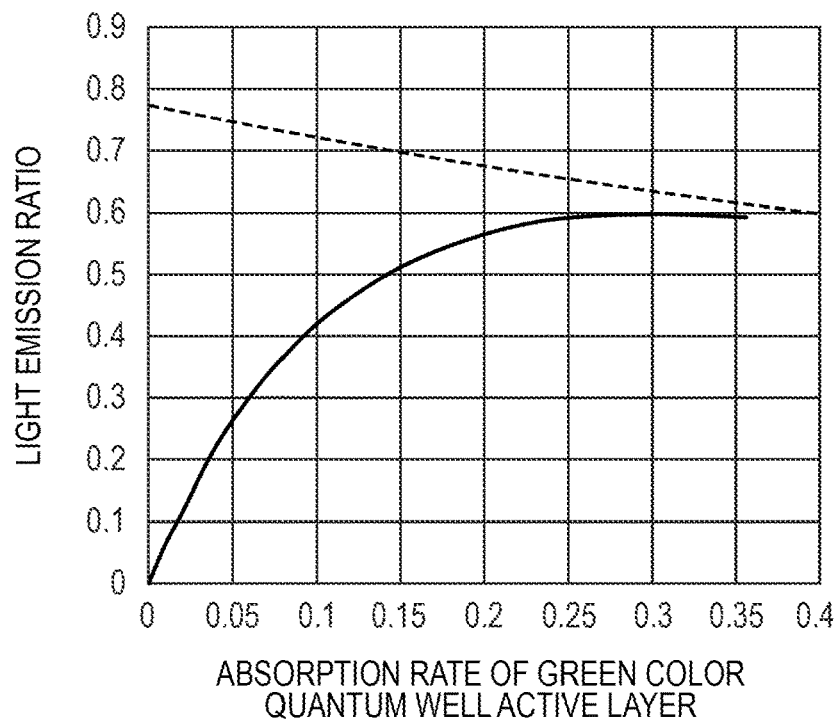
FIG. 5A is a graph showing a simulation result of an emission ratio if the absorptance of the green quantum well active layer is changed.
Figure 5B:
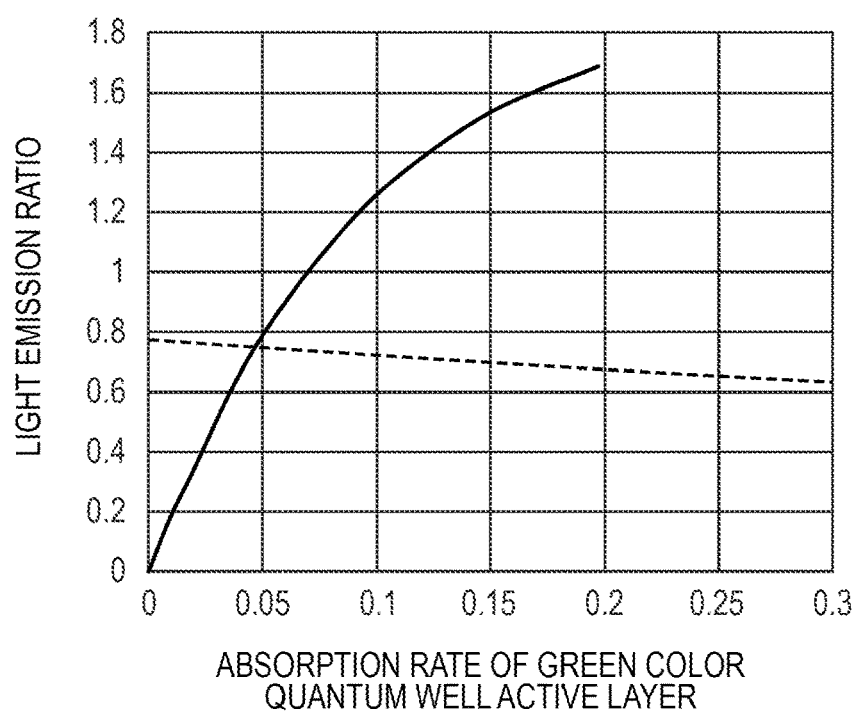
FIG. 5B is a graph showing a simulation result of an emission ratio if the absorptance of the green quantum well active layer is changed.

FIGS. 5A and 5B are graphs showing simulation results of the emission ratio when the light absorptance of the green quantum well active layer 302 is changed. The structure and characteristics of the light emitting element used in this simulation are the same as those shown in FIGS. 3A to 3C and 4.

The horizontal axis of FIGS. 5A and 5B indicates the absorptance when light having a wavelength of 450 nm is transmitted from one surface to the other surface in the green quantum well active layer 302. The vertical axis represents the light emission ratio upward from each active layer of the blue quantum well active layer 304 or the green quantum well active layer 302. In FIGS. 5A and 5B, a solid line indicates an emission ratio from the green quantum well active layer 302, and a broken line indicates an emission ratio from the blue quantum well active layer 304.

In the simulation, the amount of light emitted from the blue quantum well active layer 304 is set as 1. If blue light is absorbed by the green quantum well active layer, the light is converted to green light by 100%.

FIG. 5A is a graph showing a case where a light emitting element is used in a state where the light amount ratio of green to blue is 1:1. FIG. 5B is a graph showing a case where a light emitting element is used in a state where the light amount ratio of green to blue is 1:3. That is, FIG. 5B shows the value of the emission ratio of the green light amount three times greater than the case shown in FIG. 5A.

As shown in FIG. 5A, if the light emitting device of the present embodiment is used in a state where the luminance ratio of green to blue is 1:1, the absorptance of the green quantum well active layer 302 is preferably adjusted to about 35%.

An example of the adjustment for an insufficient green emission ratio may be a method of adjusting the emission ratio by adjusting the amount of current injected into each pixel. For example, in the case of the present embodiment, the green light emission ratio can be increased by increasing the amount of current injected into the green pixel more than the amount of current injected into the blue pixel. Further, the light emission ratio of each pixel can be adjusted by changing the reflectance of the DBR. For example, by configuring the $SiO_2$/SiN dielectric DBR 306 to reduce the reflectance of the wavelength corresponding to green, the green emission ratio can be increased.

In the case where the light emitting device of the present embodiment is used in a device such as a display device or an illumination device in which adjustment is performed in consideration of the visibility of a user, the luminance of the light emitting devices may be differentiated from each other in consideration of the difference in visibility between green and blue. If the green-to-blue light quantity ratio is 1:3, as shown in FIG. 5B, the above-described light quantity ratio is realized by setting the absorptance of the green quantum well active layer 302 to 3% or more and 7% or less (if the allowable deviation is about ±30%). Further, the above-described light quantity ratio is more suitably realized by setting the ratio to 4% or more and 6% or less (if the allowable deviation is about ±10%).

The above-described example is merely an example of a method of using the light emitting element of the present embodiment. Since the design of the absorptance of the green quantum well active layer 302 may be changed as needed depending on the reflectance of the reflecting mirror, the conversion efficiency of the light excited from the excitation light, the luminance ratio of each color, the degree of reduction of the color mixture ratio, and the like, a design different from the above-described example may be performed. For example, if the wavelength dependence of the reflectance of the reflecting mirror is different from that shown in FIG. 4 used in the present simulation, the proper absorptance changes. If the reflectance at 525 nm, which is the wavelength of green, is reduced by changing the design of the dielectric DBR to increase the emission ratio of green, the range of proper absorptance is changed to a range lower than the above-described value.

In the present embodiment, if light of two different wavelengths (e.g., blue and green) is generated, the amount of light emission itself is changed instead of removing a part of light such as an optical filter. For example, in the present embodiment, the absorption efficiency can be improved by approximately ten times by introducing a resonator structure for light having a wavelength of green. Therefore, a light emitting element capable of more efficient light emission is provided.

Third Embodiment

Figure 6A:
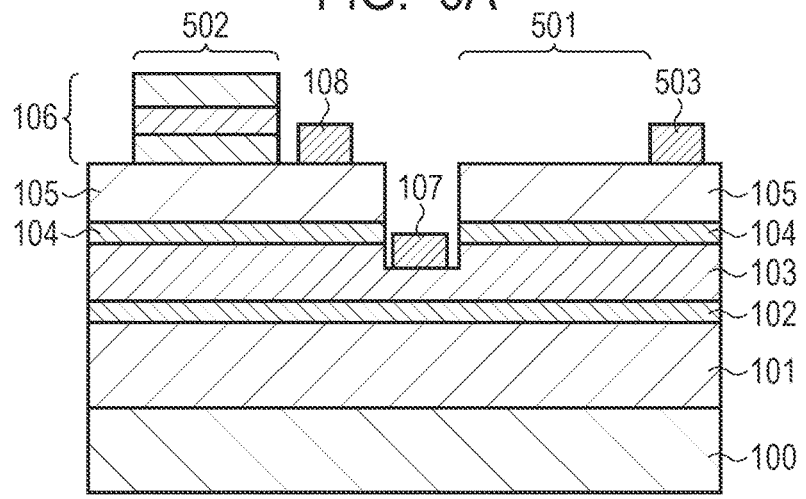
FIG. 6A is a cross-sectional view schematically showing a structure of a light emitting device according to the third embodiment.

The light emitting device of the present embodiment includes the light emitting device according to the first embodiment or the second embodiment, and is configured to be able to emit light of two wavelengths different from each other from two light emitting regions formed on the same wafer. FIG. 6A is a cross-sectional view schematically showing a first configuration example of the light emitting device according to the present embodiment.

As shown in FIG. 6A, the light emitting element of the present embodiment includes a first region 501 and a second region 502 in a plan view from a direction perpendicular with respect to the substrate 100. The first region 501 mainly emits light of a first wavelength to the outside. The second region 502 mainly emits light of a second wavelength to the outside. The first region 501 and the second region 502 are formed on the same wafer. A first reflecting mirror 106 is disposed on the third semiconductor layer 105 of the second region 502. The first reflecting mirror 106 is not disposed on the third semiconductor layer 105 in the first region 501.

The structure of the second region 502 is the same as the structure of FIG. 1 of the first embodiment. That is, the second region 502 is provided with the first reflecting mirror 106 having a high reflectance for light of the first wavelength. When a current is injected into the first active layer 104 by the first electrode 107 and the second electrode 108, the first active layer 104 emits light of a first wavelength. The second active layer 102 is excited by the light of the first wavelength, and the second active layer 102 emits light of the second wavelength. Further, the first reflecting mirror 106 has a high reflectance with respect to light of the first wavelength. Therefore, light of the second wavelength is mainly emitted from the second region 502.

In the vicinity of the first region 501, a third electrode 503 is disposed on the third semiconductor layer 105 as an electrode for injecting current into the first active layer 104 of the first region 501. When the current is injected into the first active layer 104 by the first electrode 107 and the third electrode 503, the first active layer 104 of the first region 501 emits light of the first wavelength. The first electrode 107 is a common electrode for supplying current to the first active layer 104 of the first region 501 and the first active layer 104 of the second region 502. On the other hand, the second electrode 108 and the third electrode 503 are provided independently of each other. Therefore, the light emitting element of the present embodiment has a structure in which current can be supplied independently to the first active layer 104 of the first region 501 and the first active layer 104 of the second region 502. Accordingly, the first region 501 and the second region 502 can independently emit light of different wavelengths.

Figure 6B:
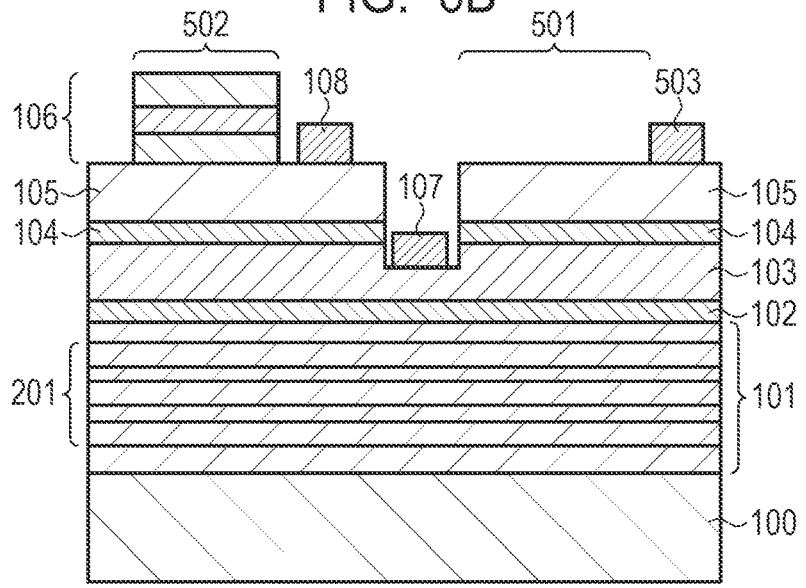
FIG. 6B is a cross-sectional view schematically showing a structure of a light emitting device according to the third embodiment.

Another configuration example of the light emitting element according to the present embodiment will be described. FIG. 6B is a cross-sectional view schematically showing a second configuration example of the light emitting element according to the present embodiment. In this configuration example, similarly to the second embodiment, the first semiconductor layer 101 includes the second reflecting mirror 201. The second reflecting mirror 201 is designed to have a high reflectance for at least light of the first wavelength.

With such a configuration, the light emission efficiency of the light of the second wavelength in the second region 502 is improved for the same reason as the one described in the second embodiment. Also in the first region 501, the light of the first wavelength emitted downward from the first active layer 104 is reflected by the second reflecting mirror 201 and returned upward. Thus, the light emission efficiency of the light of the first wavelength is also improved in the first region 501. As described above, in this configuration example, in addition to the effect similar to that of the first configuration example, the light emission efficiency can be further improved.

It should be noted that the second reflecting mirror 201 may be designed to have a high reflectance with respect to the light of the second wavelength. In this case, within the second region 502, the light of the second wavelength emitted downward from the second active layer 102 is also reflected by the second reflecting mirror 201, and returned upward. This further improves the light emission efficiency of the light of the second wavelength in the second region 502.

Figure 6C:
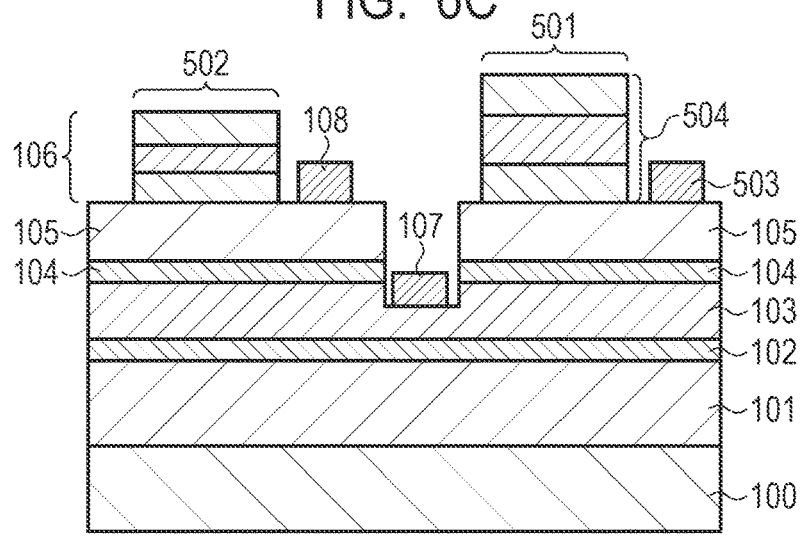
FIG. 6C is a cross-sectional view schematically showing a structure of the light emitting device according to the third embodiment.

Still another configuration example of the light emitting element according to the present embodiment will be described. FIG. 6C is a cross-sectional view schematically showing a third configuration example of the light emitting device according to the present embodiment. This configuration example is one of the configurations for reducing a component of a second wavelength included in light emitted from the first region 501.

In this configuration example, a third reflecting mirror 504 is disposed on the third semiconductor layer 105 of the first region 501. The reflectance of the third reflecting mirror 504 with respect to the light of the second wavelength is higher than the reflectance of the third reflecting mirror 504 with respect to the light of the first wavelength. The other configurations are same as the first configuration example. When current is injected from the first electrode 107 and the third electrode 503 into the first active layer 104 of the first region 501, the first active layer 104 emits light of a first wavelength. When light of the first wavelength is absorbed by the second active layer 102, the second active layer 102 emits light of a second wavelength. Since the light of the second wavelength is reflected by the third reflecting mirror 504, the component of the second wavelength included in the light emitted from the first region 501 is reduced. Accordingly, the ratio of the first wavelength included in the light emitted from the first region 501 is increased and the ratio of the second wavelength is decreased, which allows to reduce color mixture between the light of the first wavelength and the light of the second wavelength.

As described above, according to the first to third configuration examples of the present embodiment, the first region 501 and the second region 502 which emit light of different wavelengths can be formed on the same wafer. In this configuration, the structure for changing the wavelength of the emitted light is the first reflecting mirror 106 disposed on the third semiconductor layer 105. Therefore, by forming the first reflecting mirror 106 at a desired position in the wafer surface, the first region 501 and the second region 502 which emit light of different wavelengths can be formed without any process for the semiconductor layer under the first reflecting mirror 106. Therefore, a light emitting element capable of individually emitting light of two wavelengths can be formed using a simple process.

Fourth Embodiment

Figure 7:
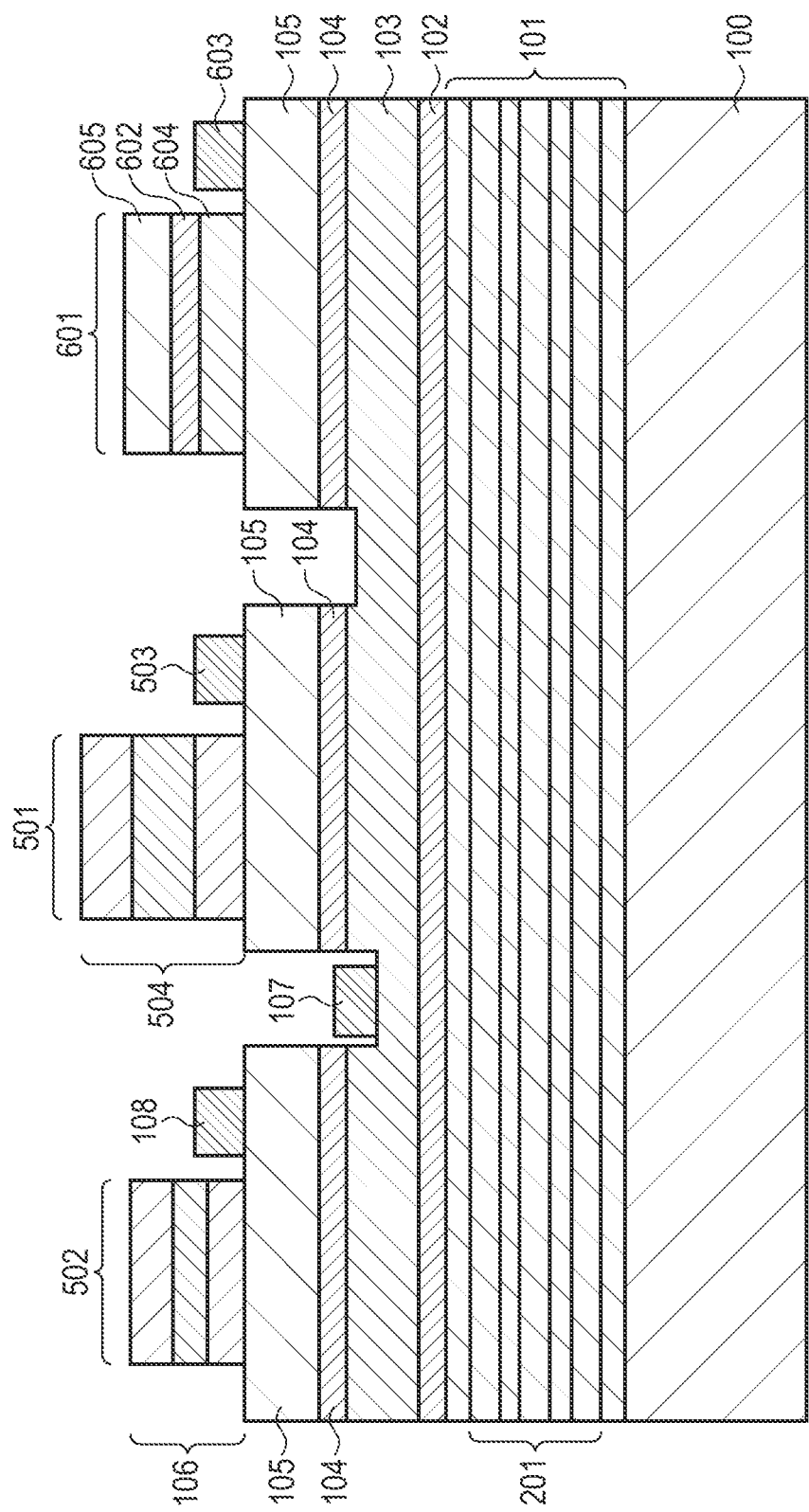
FIG. 7 is a cross-sectional view schematically showing a structure of a light emitting device according to the fourth embodiment.

The light emitting element of the present embodiment is obtained by modifying the number of light emitting regions of the third embodiment from two to three. That is, the light emitting element of the present embodiment is configured to emit light of three wavelengths different from each other from three light emitting regions formed on the same wafer. FIG. 7 is a cross-sectional view schematically showing a configuration example of a light emitting element according to the present embodiment.

In addition to the element structure of the second configuration example (FIG. 6B) of the third embodiment, the light emitting element of the present embodiment mainly includes a third region 601 which emits light of a third wavelength to the outside. In the present embodiment, a third reflecting mirror 504 is disposed on the third semiconductor layer 105 in the first region 501, similarly to the third configuration example (FIG. 6C) of the third embodiment.

In the third region 601, a cross-sectional structure below the third semiconductor layer 105 is similar to that in the first region 501 and the second region 502. In the third region 601, a fourth semiconductor layer 604, a third active layer 602, and a fifth semiconductor layer 605 are arranged in this order on the third semiconductor layer 105.

In the vicinity of the third region 601, a fourth electrode 603 is disposed on the third semiconductor layer 105 as an electrode for injecting current into the first active layer 104 in the third region 601. When the current is injected into the first active layer 104 by the first electrode 107 and the fourth electrode 603, the first active layer 104 in the third region 601 emits light of a first wavelength. The light of the first wavelength excites the third active layer 602, and the third active layer 602 emits light of a third wavelength. The light of the third wavelength may be, for example, red light having a wavelength of about 630 nm.

According to the present embodiment, the first region 501, the second region 502, and the third region 601 which emit light of different wavelengths can be formed on the same wafer. In this structure, the structure for changing the wavelength of the emitted light is each layer disposed on the third semiconductor layer 105, that is, the first reflecting mirror 106, the third reflecting mirror 504, the fourth semiconductor layer 604, the third active layer 602, and the fifth semiconductor layer 605. Therefore, by forming these layers at desired locations in the wafer surface, the first region 501, the second region 502, and the third region 601 which emit light of different wavelengths can be formed without any process for the semiconductor layer under the layers.

In the present embodiment, light of the third wavelength is emitted by optical excitation caused by light emission from the first active layer 104 of the third region 601. In order to realize the above, the fourth semiconductor layer 604, the third active layer 602, and the fifth semiconductor layer 605 need not be electrically connected to the third semiconductor layer 105, and may be located at a predetermined position. Therefore, a light emitting element capable of individually emitting light of three wavelengths can be formed using a simple process.

The fourth semiconductor layer 604, the third active layer 602, and the fifth semiconductor layer 605 may be formed on the third semiconductor layer 105 by epitaxial growth, for example. However, it may be formed using other methods.

An example of the other methods mentioned above will be described below. Another transfer substrate in which the fifth semiconductor layer 605, the third active layer 602, and the fourth semiconductor layer 604 are formed in this order from the substrate side is prepared in advance. The transfer substrate is bonded to the substrate 100 on which the semiconductor layer below the third semiconductor layer 105 is formed, and then only the transfer substrate is removed by wet etching or the like. Also by this method, the fourth semiconductor layer 604, the third active layer 602, and the fifth semiconductor layer 605 can be formed on the third semiconductor layer 105. If the p-type dopant is doped as described above, the crystal quality of the semiconductor layer may deteriorate. Therefore, the crystal quality of a layer formed by epitaxial growth on the semiconductor layer doped with the p-type dopant may deteriorate. In this method, it is not necessary to form a semiconductor layer on the p-type third semiconductor layer 105 by epitaxial growth. Thus, the quality of the third active layer 602 can be improved and the light emission characteristics can be improved.

The step of determining the first region 501 and the second region 502 such as the formation of the first reflecting mirror 106 and the third reflecting mirror 504 is preferably performed after bonding the fourth semiconductor layer 604, the third active layer 602, and the fifth semiconductor layer 605 to determine a position of the third region 601. Due to this order, the substrate bonding can be performed on a flat substrate immediately after epitaxial growth, not on a substrate having roughness after the process. The above configuration allows to have a better state of the bonding surface, and to lower the process difficulty. As a result, the yield is improved. Further, the positions of the first region 501 and the second region 502 can be determined with high positional accuracy by photolithography based on the position of the third region 601 that has already been formed. Therefore, as compared with the case of determining the first region 501 and the second region 502 in advance, the required accuracy in alignment at the time of bonding can be lowered. Further, as described above, it is possible to arrange elements of multiple colors on the entire surface of the wafer by one bonding, as compared with a method in which light emitting elements manufactured for each color are mounted on a substrate of a display device. Therefore, improving the yield and reducing the mounting cost can be achieved.

Fifth Embodiment

Figure 8:
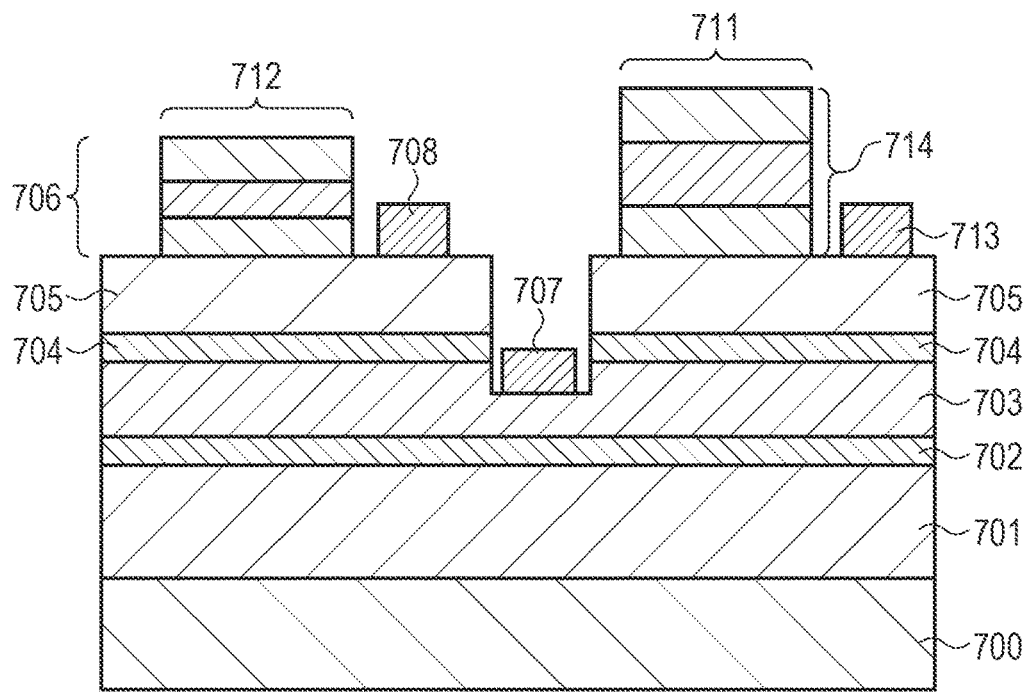
FIG. 8 is a cross-sectional view schematically showing a structure of a light emitting device according to the fifth embodiment.

Another specific design example and another manufacturing process example of the light emitting element having two light emitting regions described in the third embodiment will be described below as a fifth embodiment. FIG. 8 is a cross-sectional view schematically showing a structure of a light emitting device according to the present embodiment. Since the structure of the light emitting element of the present embodiment is similar to that of the third configuration example (FIG. 6C) of the third embodiment, detailed descriptions of the structure may be omitted or simplified.

The light emitting device of the present embodiment is formed by sequentially epitaxially growing an i-type GaN layer 701, an i-type green quantum well active layer 702, an n-type GaN layer 703, an i-type blue quantum well active layer 704, and a p-type GaN layer 705 on a sapphire substrate 700. A buffer layer (not shown) is formed between the sapphire substrate 700 and the GaN layer 701.

The green quantum well active layer 702 includes an InGaN well layer and a GaN barrier layer. In the green quantum well active layer 702, the In composition of the InGaN well layer is about 20%, and in this case, the central emission wavelength is 525 nm.

The blue quantum well active layer 704 also includes an InGaN well layer and a GaN barrier layer. In the blue quantum well active layer 704, the In composition of the InGaN well layer is about 15%, and in this case, the central emission wavelength is 450 nm.

The light emitting device of the present embodiment includes a region 711 that emits blue light and a region 712 that emits green light in a plan view from the direction perpendicular to the sapphire substrate 700. In the light emitting device, after a formation of the GaN layer 705, an isolation trench for isolating the regions 711 and 712 from each other is formed. The depth of the isolation trench is set such that a position of the bottom surface of the isolation trench is between the upper surface and the lower surface of the GaN layer 703. After formation of the isolation trench, an n-electrode 707 for applying a common potential to each region is formed at the bottom of the isolation trench. P-electrodes 708 and 713 for individually applying potentials to the regions 712 and 711 are formed on the GaN layer 705. Further, a reflecting mirror 706 mainly reflecting light of a blue wavelength and a reflecting mirror 714 mainly reflecting light of a green wavelength are formed in the regions 712 and 711, respectively.

The reflecting mirror 706 includes six pairs of stacked films of SiN and $SiO_2$. The film thickness of each layer is determined in consideration of the refractive index of each layer so that the optical film thickness is one fourth of the wavelength of blue light (450 nm). The reflecting mirror 714 includes six pairs of stacked films of SiN and $SiO_2$. Each film thickness is determined in consideration of the refractive index of each film so that the optical film thickness becomes one fourth of the wavelength of green light (525 nm).

According to the present embodiment, it is possible to manufacture a light emitting element in which a region 711 emitting light of a blue wavelength and a region 712 emitting light of a green wavelength are formed on the same wafer using a simple process.

Sixth Embodiment

Figure 9:
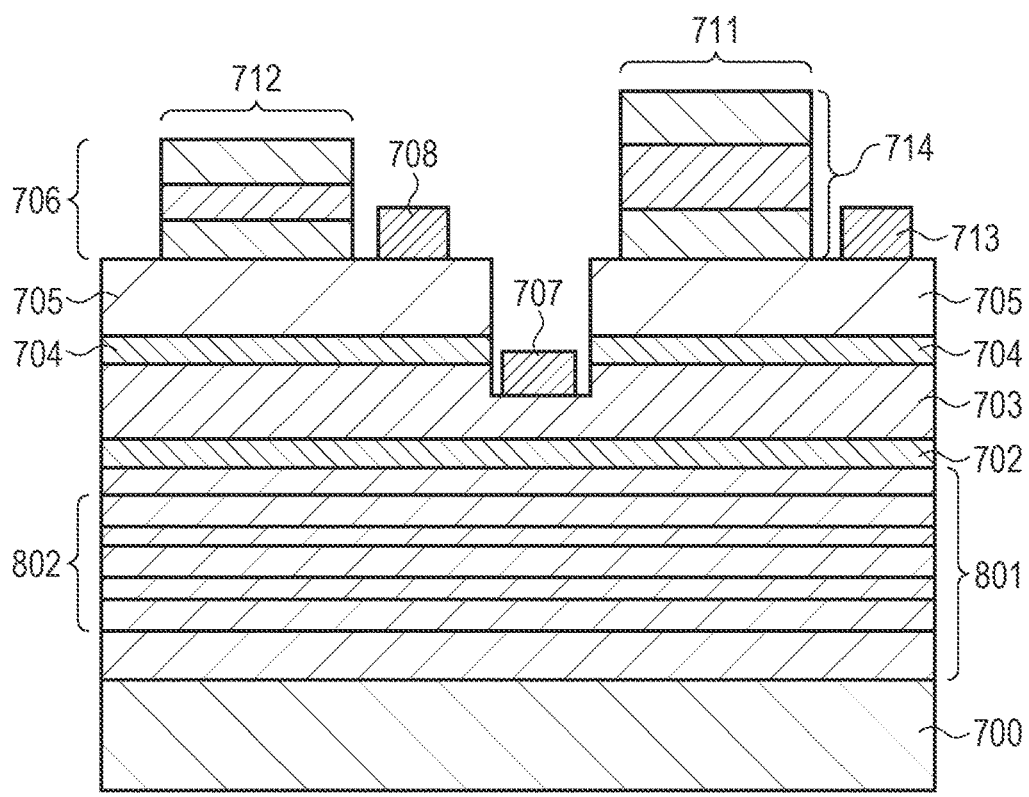
FIG. 9 is a cross-sectional view schematically showing a structure of a light emitting device according to the sixth embodiment.

The light emitting device according to a sixth embodiment will described below. According to the sixth embodiment, the DBR corresponding to the second reflecting mirror 201 in the second configuration example of the third embodiment is added to the light emitting device according to the fifth embodiment. FIG. 9 is a cross-sectional view schematically showing a structure of a light emitting device according to the present embodiment. In the light emitting device of the present embodiment, the i-type GaN layer 801 includes an i-type DBR layer 802. Other structures are the same as those of the fifth embodiment, and thus description thereof will be omitted.

The DBR layer 802 has a stacked structure in which ten pairs of AlGaN layers and GaN layers are alternately stacked. The film thickness of each layer is determined in consideration of the refractive index of each layer so that the optical film thickness is one fourth of the wavelength of blue light (450 nm). The thickness and the like of each layer are set such that the DBR layer 802 and the reflecting mirror 706 form a resonator for a blue wavelength.

With this configuration, the blue light (wavelength of 450 nm) resonates in the resonator in the region 712. Thus, the absorptance of blue light in the green quantum well active layer 702 is increased, and the emission efficiency of green light from the green quantum well active layer 702 is improved. On the other hand, in the region 711, of the light generated in the blue quantum well active layer 704, the light emitted toward the sapphire substrate 700 side is reflected by the DBR layer 802 and travels upward, so that the light emission efficiency of the blue light is improved.

Therefore, in addition to the effect similar to that of the fifth embodiment, the light emission efficiency of blue and green light is further improved than that of the fifth embodiment.

Seventh Embodiment

Figure 10:
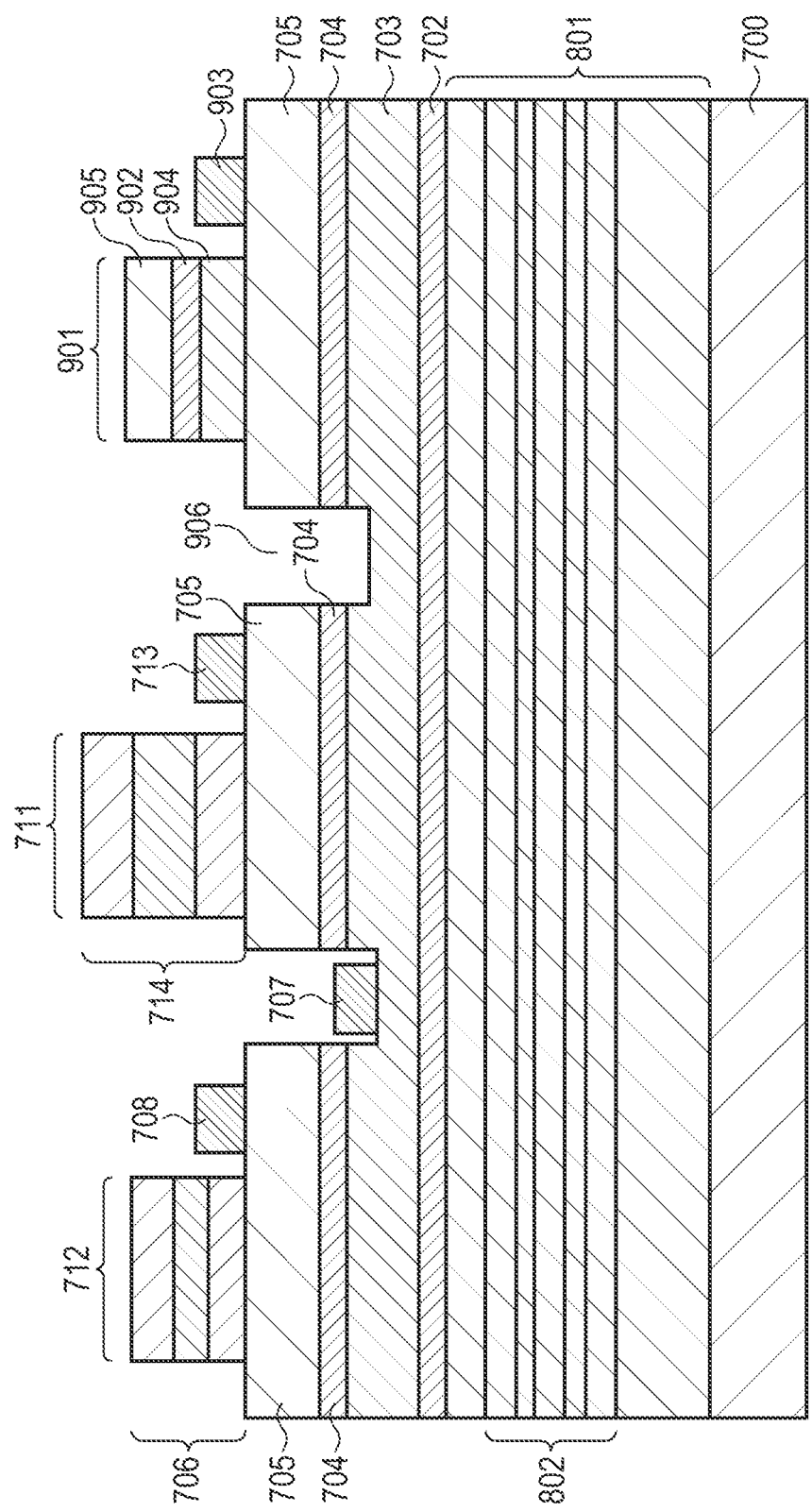
FIG. 10 is a cross-sectional view schematically showing a structure of a light emitting device according to the seventh embodiment.

The seventh embodiment is described below. According to the seventh embodiment, the light emitting device according to the sixth embodiment is modified to emit light of three colors as in the fourth embodiment. FIG. 10 is a cross-sectional view schematically showing a structure of a light emitting device according to the present embodiment. The light emitting device of the present embodiment further includes a region 901 that emits red light when viewed from a plane perpendicular to the sapphire substrate 700. The other structures are same as those of the sixth embodiment, and thus descriptions thereof will be omitted.

In the region 901, an AlInP cladding layer 904, an AlGaInP active layer 902, and an AlInP cladding layer 905 are formed in this order on the GaN layer 705. The AlGaInP active layer 902 has its central emission wavelength adjusted to 630 nm.

A p-electrode 903 for applying a potential to the region 901 is formed on the GaN layer 705 of the region 901. When current is injected into the blue quantum well active layer 704 by the n-electrode 707 and the p-electrode 903, the blue quantum well active layer 704 emits blue light. The AlGaInP active layer 902 is excited by blue light, and the AlGaInP active layer 902 emits red light. Thus, red light is emitted from the region 901.

Figure 11A:
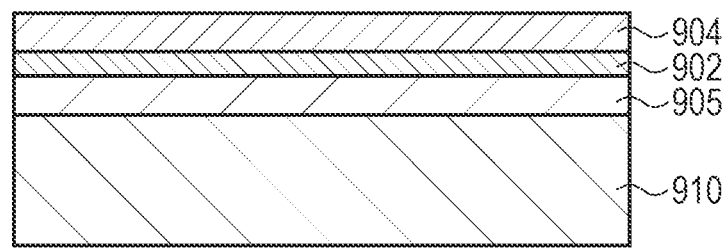
FIG. 11A is a cross-sectional view schematically showing a structure of a transfer substrate according to the seventh embodiment.
Figure 11B:
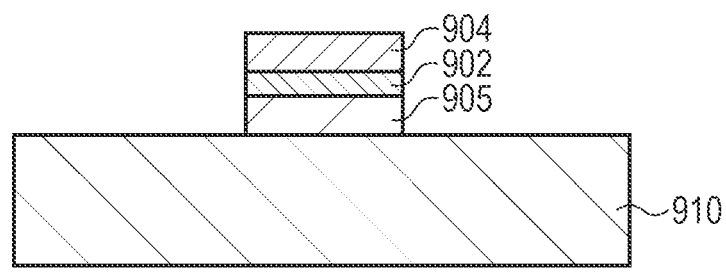
FIG. 11B is a cross-sectional view schematically showing a structure of the transfer substrate according to the seventh embodiment.

Referring to FIGS. 11A and 11B, an outline of a method of manufacturing the light emitting device of the present embodiment will be described. FIGS. 11A and 11B are cross-sectional views schematically showing the structure of the transfer substrate according to the present embodiment.

As shown in FIG. 11A, an AlInP cladding layer 905, an AlGaInP active layer 902, and an AlInP cladding layer 904 are epitaxially grown in this order on a GaAs substrate 910 different from the sapphire substrate 700. Next, as shown in FIG. 11B, patterning is performed by etching the AlInP cladding layer 904, the AlGaInP active layer 902, and the AlInP cladding layer 905 to leave only a portion corresponding to the light emitting region. Thereafter, a polyimide layer (not shown) is formed on the upper surface of FIG. 11B by spin coating. By these processes, a transfer substrate for transfer by bonding is completed.

Then, the GaN layer 705 of the sapphire substrate 700 having the layers up to the GaN layer 705 shown in FIG. 10 and the AlInP cladding layer 904 of the transfer substrate are heated in a state in which they are aligned to face each other. Thus, the GaN layer 705 and the AlInP cladding layer 904 are bonded to each other via the polyimide layer. Then, the GaAs substrate 910 is removed by wet etching. Thus, the AlInP cladding layer 904, the AlGaInP active layer 902, and the AlInP cladding layer 905 are transferred onto the GaN layer 705. Then, similar to the fifth embodiment, the separation groove 906 is formed, the reflecting mirrors 706 and 714 are formed, and the light emitting device shown in FIG. 10 is completed.

According to the present embodiment, it is possible to manufacture a light emitting element in which a region 711 for emitting light of a blue wavelength, a region 712 for emitting light of a green wavelength, and a region 901 for emitting light of a red wavelength are formed on the same wafer using a simple process.

Modified Embodiments

The present invention is not limited to the above-described embodiments, and various modifications are possible. For example, an example in which a configuration of a part of any embodiment is added to another embodiment or an example in which a configuration of a part of another embodiment is substituted is also included in the embodiments of the present invention.

The embodiments described above are merely examples of implementations for carrying out the present invention, and the technical scope of the present invention should not be construed as being limited thereto. That is, the present invention can be implemented in various forms without departing from the technical idea thereof or the main characteristics thereof.

According to the present invention, it is possible to provide a light emitting element and a method of manufacturing the light emitting element which can be manufactured in a simple process.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A light emitting element comprising:
   a first active layer that emits light having a first wavelength by injecting current;
   a second active layer that emits light having a second wavelength different from the first wavelength by absorbing the light having the first wavelength; and
   a first reflecting mirror in which a reflectance of the light having the first wavelength is higher than a reflectance of the light having the second wavelength,
   wherein the first reflecting mirror is disposed at a position closer to an emission end, from which the light emitted by the first active layer or the second active layer exits outside, than the first active layer and the second active layer,
   wherein the light emitting element further comprises, in a plan view, a first region and a second region,
   wherein the first active layer and the second active layer are disposed in each of the first region and the second region,
   wherein an emitting amount of the light having the first wavelength is greater than an emitting amount of the light having the second wavelength in the first region, and
   wherein an emitting amount of the light having the second wavelength is greater than an emitting amount of the light having the first wavelength in the second region.

2. The light emitting element according to claim 1, wherein the first active layer is disposed closer to the emission end than the second active layer.

3. The light emitting element according to claim 1, further comprising a second reflecting mirror in which a reflectance of the light having the first wavelength is higher than a reflectance of the light having the second wavelength,
   wherein the second reflecting mirror is disposed on a side opposite to the first reflecting mirror with respect to the first active layer and the second active layer.

4. The light emitting element according to claim 3, wherein the first reflecting mirror and the second reflecting mirror constitute a resonator for the light having the first wavelength.

5. The light emitting element according to claim 4, wherein an absorptance of the light having the first wavelength in the second active layer is 3% to 7%.

6. The light emitting element according to claim 4, wherein an absorptance of the light having the first wavelength in the second active layer is 4% to 6%.

7. The light emitting element according to claim 1, wherein the first active layer is inserted between a semiconductor layer of a first conductivity type and a semiconductor layer of a second conductivity type opposite to the first conductivity type.

8. The light emitting element according to claim 7, wherein the second active layer is inserted between a semiconductor layer of the first conductivity type or an i-type and a semiconductor layer of the first conductivity type.

9. The light emitting element according to claim 1, further comprising a substrate,
   wherein the first active layer, the second active layer, and the first reflecting mirror are stacked on the substrate, and
   wherein a p-type dopant is not doped in a semiconductor layer disposed between the substrate and the first or second active layer disposed farther from the substrate.

10. The light emitting element according to claim 1, wherein, in the plan view, the first reflecting mirror is disposed in the second region, and the first reflecting mirror is not disposed in the first region.

11. The light emitting element according to claim 1, further comprising a third reflecting mirror in which a reflectance of the light having the second wavelength is higher than a reflectance of the light having the first wavelength,
   wherein, in the plan view, the third reflecting mirror is disposed in the first region.

12. The light emitting element according to claim 1, further comprising, in the plan view, a third region from which light having a third wavelength different from the first wavelength and the second wavelength is emitted,
   wherein an emitting amount of the light having the third wavelength is greater than an emitting amount of the light having the first wavelength and an emitting amount of the light having the second wavelength in the third region.

13. The light emitting element according to claim 12, further comprising a third active layer that emits the light having the third wavelength in the third region,
   wherein the third active layer is disposed at a position closer to the emission end than the first active layer.

14. The light emitting element according to claim 12, wherein the light having the first wavelength is blue light, the light of the second wavelength is green light, and the light of the third wavelength is red light.

15. The light emitting element according to claim 1, wherein the first reflecting mirror is a distributed Bragg reflecting mirror including a plurality of dielectric layers having different refractive indices.

16. A manufacturing method of a light emitting element comprising:
- forming a second active layer that emits light having a second wavelength different from a first wavelength by absorbing the light having the first wavelength;
- forming a first active layer that emits the light having the first wavelength by injecting current; and
- forming a first reflecting mirror in which a reflectance of the light having the first wavelength is higher than a reflectance of the light having the second wavelength,
- wherein the first reflecting mirror is disposed at a position closer to an emission end, from which the light emitted by the first active layer or the second active layer exits outside, than the first active layer and the second active layer,
- wherein the light emitting element further comprises, in a plan view, a first region and a second region,
- wherein the first active layer and the second active layer are disposed in each of the first region and the second region,
- wherein an emitting amount of the light having the first wavelength is greater than an emitting amount of the light having the second wavelength in the first region, and
- wherein an emitting amount of the light having the second wavelength is greater than an emitting amount of the light having the first wavelength in the second region.

17. The light emitting element according to claim 1, wherein the light having the first wavelength is blue light.

18. The light emitting element according to claim 17, wherein the light having the second wavelength is green light.

* * * * *